(12) United States Patent
Sugawa et al.

(10) Patent No.: US 8,569,805 B2
(45) Date of Patent: Oct. 29, 2013

(54) SOLID-STATE IMAGE SENSOR AND METHOD FOR PRODUCING THE SAME

(75) Inventors: Shigetoshi Sugawa, Sendai (JP); Yasushi Kondo, Kyoto (JP); Hideki Tominaga, Uji (JP)

(73) Assignees: Tohoku University, Miyagi (JP); Shimadu Corporation, Kyoto (JP)

( * ) Notice: Subject to any disclaimer, the term of this patent is extended or adjusted under 35 U.S.C. 154(b) by 700 days.

(21) Appl. No.: 12/676,520

(22) PCT Filed: Sep. 4, 2008

(86) PCT No.: PCT/JP2008/002428
§ 371 (c)(1),
(2), (4) Date: Mar. 4, 2010

(87) PCT Pub. No.: WO2009/031304
PCT Pub. Date: Mar. 12, 2009

(65) Prior Publication Data
US 2010/0176423 A1    Jul. 15, 2010

(30) Foreign Application Priority Data

Sep. 5, 2007 (JP) .................................. 2007-230181

(51) Int. Cl.
*H01L 27/148* (2006.01)
*H01L 21/00* (2006.01)
*H04N 3/14* (2006.01)

(52) U.S. Cl.
USPC .... 257/225; 257/239; 257/292; 257/E31.075; 257/E31.097; 257/E27.154; 257/E27.159; 348/294; 438/60

(58) Field of Classification Search
None
See application file for complete search history.

(56) References Cited

U.S. PATENT DOCUMENTS

| 8,269,838 B2* | 9/2012 | Sugawa et al. ............. 348/208.1 |
| 2003/0136981 A1 | 7/2003 | Sugiyama |
| 2004/0245433 A1 | 12/2004 | Koyama |
| 2005/0274874 A1* | 12/2005 | Nozaki et al. ............. 250/208.1 |

(Continued)

FOREIGN PATENT DOCUMENTS

| EP | 0954032 A2 | 11/1999 |
| JP | 2001-345441 A | 12/2001 |

(Continued)

OTHER PUBLICATIONS

Chinese Office Action dated Mar. 29, 2012, issued in corresponding Chinese Patent Application No. 200880105613.4.

(Continued)

*Primary Examiner* — Alonzo Chambliss
(74) *Attorney, Agent, or Firm* — Sughrue Mion, PLLC

(57) ABSTRACT

A floating diffusion (331) is created substantially at center of the light-receiving surface of an embedded photodiode (31), with a gate electrode of a transfer transistor (32) surrounding the floating diffusion. The concentration (or depth) of impurities in a $p^+$-type semiconductor region, n-type semiconductor region or p-well region is changed in an inclined form so that a potential gradient being inclined downwards from the circumference to the center is created when an appropriate bias voltage is applied to the pn junction. The photocharges produced by incident light are rapidly moved along the potential gradient toward the center. Even in the case where the photocharge storage time is short, the photocharges can be efficiently collected since the maximum moving distance from the circumference of the photodiode (31) to the floating diffusion (331). Thus, the photocharges produced by the photodiode (31) are efficiently utilized, whereby the detection sensitivity is improved.

11 Claims, 14 Drawing Sheets

(56) References Cited

U.S. PATENT DOCUMENTS

| | | |
|---|---|---|
| 2006/0289911 A1 | 12/2006 | Lee et al. |
| 2007/0152291 A1 | 7/2007 | Lim |
| 2010/0188538 A1* | 7/2010 | Sugawa et al. ............... 348/294 |
| 2010/0208115 A1* | 8/2010 | Sugawa et al. ............... 348/308 |

FOREIGN PATENT DOCUMENTS

| | | |
|---|---|---|
| JP | 2003-218332 A | 7/2003 |
| JP | 2006-245522 A | 9/2006 |
| JP | 2007-073864 A | 3/2007 |
| JP | 2007-081083 A | 3/2007 |

OTHER PUBLICATIONS

Chinese Office Action dated Apr. 13, 2011, issued in corresponding Chinese Patent Application No. 200880105713.4.
Korean Office Action dated Apr. 19, 2011, issued in corresponding Korean Patent Application No. 10-2010-7003064.
Supplementary European Search Report dated Jun. 27, 2011, issued in corresponding European Patent Application No. 08828900.4.
Yasushi Kondo et al., "Development of "Hypervision HPV-1" High-speed Video Camera", Shimadzu Review, Sep. 30, 2005, pp. 79-86, vol. 62, Nos. 1-2.
Taiwanese Office Action dated Jan. 13, 2012, issued in corresponding Chinese Patent Application No. 97134051.
European Office Action dated Feb. 13, 2012, issued in corresponding European Application No. 08 828 900.4-2203.
Notice of Rejection for corresponding Taiwanese Patent Application No. 97134051 dated Aug. 21, 2012.
Office Action dated Oct. 30, 2012 in corresponding Chinese Patent Application No. 200880105613.4.

\* cited by examiner

Fig. 7
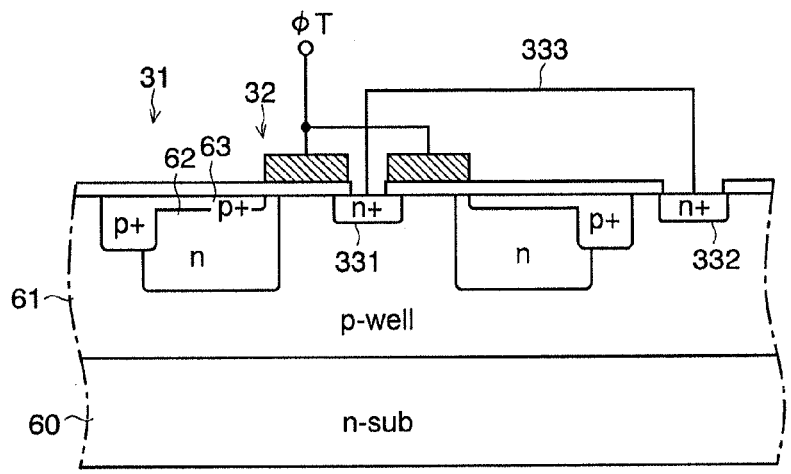
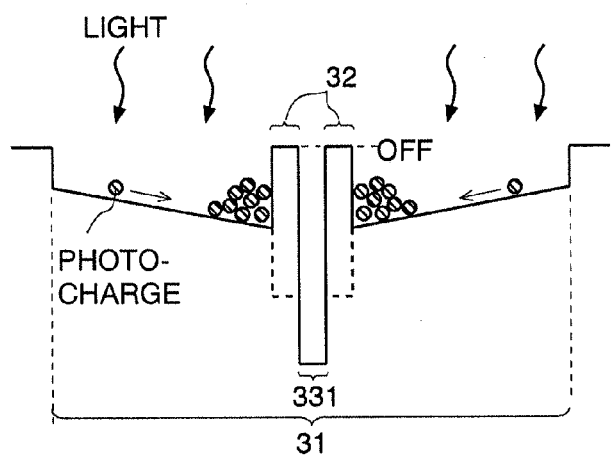
Fig. 8 (a)
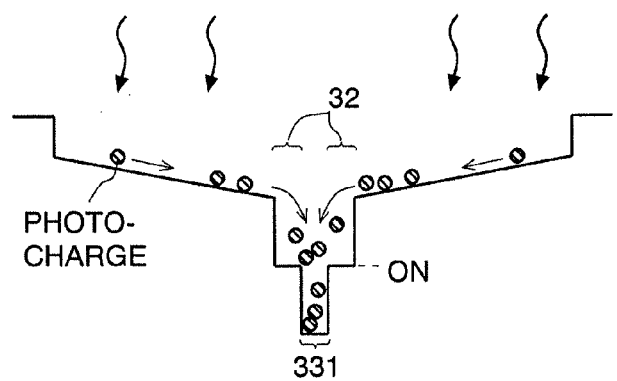
Fig. 8(b)

SOLID-STATE IMAGE SENSOR AND METHOD FOR PRODUCING THE SAME

CROSS REFERENCE TO RELATED APPLICATIONS

This application is a National Stage of International Application No. PCT/JP2008/002428 filed Sep. 4, 2008, claiming priority based on Japanese Patent Application No. 2007-230181, filed Sep. 5, 2007, the contents of all of which are incorporated herein by reference in their entirety.

TECHNICAL FIELD

The present invention relates to a solid-state image sensor and a method for producing this sensor. More specifically, it relates to a solid-state image sensor capable of high-speed operations suitable for taking images of high-speed phenomena such as destructions, explosions and combustions, and a method for producing such a sensor.

BACKGROUND ART

High-speed imaging devices (high-speed video cameras) for taking consecutive images of high-speed phenomena such as explosions, destructions, combustions, collisions and discharges for only a short period of time have been conventionally developed (for example, refer to Non-Patent Document 1 and other documents). Such high-speed imaging devices need to perform an ultrahigh-speed imaging operation that exceeds a level of approximately one million frames per second. Accordingly, they use solid-state image sensors capable of high-speed operations, which have special structures different from those of the imaging devices conventionally used in normal video cameras, digital cameras and similar devices.

One example of this type of solid-state image sensor is disclosed in Patent Document 1 and other documents, which is referred to as an in-situ storage image sensor (IS-CCD). An outline of this image sensor is as follows: A storage CCD, which also serves for the transfer of a specified number of recorded images (frames), is provided for each photodiode as a photo-receiver. During an imaging operation, pixel signals resulting from photoelectric conversion by the photodiode are sequentially transferred to the storage CCD. After the imaging operation is completed, the pixel signals corresponding to the specified number of record frames stored in the storage CCD are collectively read, and the images corresponding to the specified number of record frames are reproduced outside the image sensor. During the imaging operation, pixel signals exceeding the specified number of image frames are discarded from the oldest ones. Thus, the latest set of pixel signals corresponding to the specified number of frames are held in the storage CCD. This means that, when the transfer of pixel signals to the storage CCD is suspended at the completion of the imaging operation, one can obtain the latest series of images ranging from the completion of the imaging operation back through a period of time corresponding to the specified number of record frames.

In such a high-speed imaging operation, the period of time in which the photodiodes are exposed to light to obtain one frame of pixel signals is extremely short as compared to the normal imaging operation. For example, in the case of a high-speed imaging operation at one million frames per second, the exposure time for one frame of image is equal to or shorter than 1 μsec. Therefore, to ensure an adequate detection sensitivity, it is necessary to receive the largest possible amount of light by the photodiode in each pixel. Accordingly, it is desirable to provide the photodiode with the largest possible light-receiving surface. However, increasing the size of the light-receiving surface of the photodiode causes the following problem.

FIG. 21 is a plan view showing a pixel structure using a normal type of embedded photodiode. This structure has a floating diffusion FD located on one side of the photodiode PD. When a transfer transistor TX provided between them is turned on, photocharges flow from the photodiode PD to the floating diffusion FD and are stored therein. RG is a transistor for resetting the floating diffusion FD.

In this structure, when the size of the light-receiving surface of the photodiode is increased, the photocharges produced by the photodiode PD requires a non-negligible length of time to reach the floating diffusion PD, and a portion of the charges cannot be able to reach the floating diffusion within the predetermined short photoelectric conversion time. As a result, the photocharge usage efficiency will deteriorate, and the detection sensitivity will not be improved to the expected level even if the size of the light-receiving surface of the photodiode; rather, it will be a major cause of image-quality deterioration.

Patent Document 1: Japanese Unexamined Patent Application Publication No. 2001-345441
Non-Patent Document 1: Kondo et al., "Kousokudo Bideo Kamera HyperVision HPV-1 no Kaihatsu (Development of "HyperVision HPV-1" High-Speed Video Camera)", *Shimadzu Hyouron* (*Shimadzu Review*), Shimadzu Hyouron Henshuu-bu, Sep. 30, 2005, Vol. 62, No. 1/2, pp. 79-86

DISCLOSURE OF THE INVENTION

Problem to be Solved by the Invention

The present invention has been developed in view of the aforementioned problem, and its objective is to provide a solid-state image sensor capable of efficiently using the photocharges produced by the photodiodes to improve the detection sensitivity even in a high-speed imaging operation in which the photocharge storage time available for taking one frame of image is short. The present invention also provides a method for producing such an image sensor.

Means for Solving the Problems

A solid-state image sensor according to the present invention aimed at solving the aforementioned problem is a solid-state image sensor having a plurality of pixels arranged thereon, which is characterized in that each of the pixels includes a photodiode for receiving light and producing photocharges, a floating region formed in the central portion of the light-receiving surface of the photodiode, and a transfer transistor having a gate surrounding the floating region.

In the solid-state image sensor according to the present invention, it is desirable that a potential is changed from the circumferential portion of the light-receiving surface toward the central portion thereof so that the photocharges produced by the photodiode are moved toward the central portion of the light-receiving surface.

As a variation of the solid-state image sensor according to the present invention, the concentration and/or depth of an impurity injected in a substrate may be changed in an inclined form from the circumferential portion of the light-receiving surface of the photodiode to the central portion thereof.

As another variation of the solid-state image sensor according to the present invention, the concentration and/or depth of an impurity injected in a substrate may be changed in a step-like form from the circumferential portion of the light-receiving surface of the photodiode to the central portion thereof.

In practice, the difference between the inclined form and step-like form may be unclear. For example, in the case where an impurity, such as phosphorus (P), arsenic (A) or boron (B), is introduced into a base (e.g. a p-well) laminated to a semiconductor substrate by ion injection or other methods, when an annealing process using heat or the like is performed after a step-like change in the concentration and/or depth of the impurity is created, the impurity diffuses, whereby the corner of the impurity layer is rounded and the layer approximates to an inclined form.

In one variation of the method for producing the solid-state image sensor according to the present invention, the potential change from the circumferential portion of the light-receiving surface of the photodiode to the central portion thereof is created by changing the depth of injection of an impurity ion into a substrate by using a plurality of photomasks.

In another variation of the method for producing the solid-state image sensor according to the present invention, the potential is changed from the circumferential portion of the light-receiving surface of the photodiode toward the central portion thereof by changing the amount of injection of an impurity ion into a substrate by using a plurality of photomasks.

Effects of the Invention

In the solid-state image sensor according to the present invention, the floating region, such as a floating diffusion, is formed substantially at the center of the light-receiving surface of the photodiode. This design significantly reduces the maximum distance from a given point on the light-receiving surface to the floating region as compared to case where the floating region is formed at one end of the light-receiving surface of the photodiode, so that the time required for the photocharges produced by the photodiode to reach the floating region is shortened. Therefore, even if the photocharge storage time is limited or the light-receiving surface of the photodiode is enlarged, there will be only a small amount of charges that will be discarded before reaching the floating region, i.e. that cannot be reflected in the optical signal, whereby the detection sensitivity and the S/N ratio are improved.

In the case where the potential is changed from the circumferential portion to the central portion of the light-receiving surface, the inclined or step-like potential change due to the difference in the concentration and/or depth of an impurity helps the photocharges produced by the photodiode to move from the circumference to the center of the light-receiving surface. Therefore, the photocharges easily accumulate around the transfer transistor, and when the transfer transistor is on, they will be efficiently and promptly transferred to the floating region. Thus, even in the case where the light-receiving surface of the photocharge is large-sized and the photocharge storage time is short, the photocharges produced by the photodiode will be efficiently collected and eventually reflected in the signal, whereby the detection sensitivity and S/N ratio are improved, so that the images obtained by high-speed imaging will have better qualities.

BRIEF DESCRIPTION OF THE DRAWINGS

FIG. 7 is a schematic vertical sectional view of the photoelectric conversion area and other important elements in the solid-state image sensor of the present embodiment.

FIGS. 8(a) and 8(b) are schematic potential diagrams at the vertical section indicated by the arrowed line A-A' in FIG. 6.

EXPLANATION OF NUMERALS

1 . . . Semiconductor Substrate
2, 2a, 2b . . . Pixel Area
10 . . . Pixel
11 . . . Photoelectric Conversion Area
12 . . . Pixel Circuit Area
13 . . . Wiring Area
14, 141 . . . Pixel Output Line 15 . . . Drive Line
31 . . . Photodiode
32 . . . Transfer Transistor
33, 331, 332 . . . Floating Diffusion
333 . . . Metallic Wiring
34 . . . Storage Transistor
35 . . . Reset Transistor
36 . . . Storage Capacitor
37, 40 . . . Transistor
38, 41 . . . Selection Transistor
39 . . . Current Source
43 . . . Source Follower Amplifier
60 . . . n-type silicon semiconductor substrate
61 . . . p-well region
62 . . . n-type semiconductor region
63 . . . $p^+$-type semiconductor region

BEST MODE FOR CARRYING OUT THE INVENTION

A solid-state image sensor, which is an embodiment of the present invention, and a method for producing this image sensor are hereinafter described with reference to the attached drawings.

Figure 1:
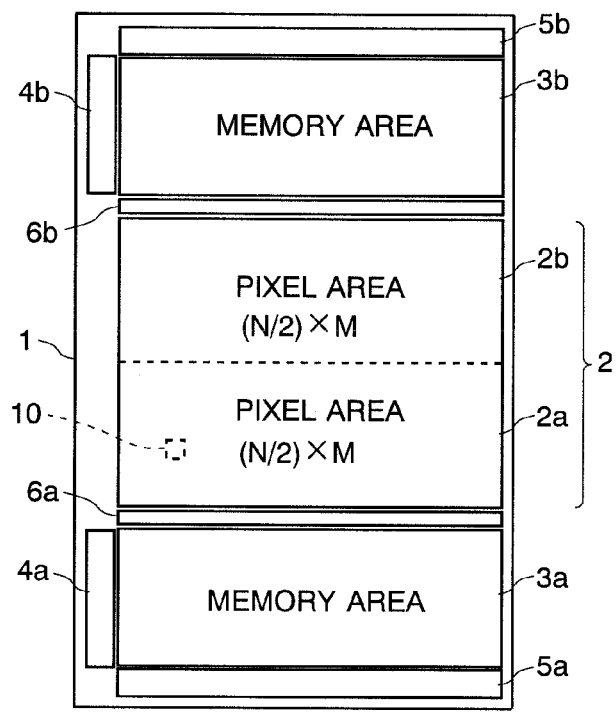
FIG. 1 is a schematic plan view showing the layout on a semiconductor chip of a solid-state image sensor which is an embodiment of the present invention.
Figure 3:
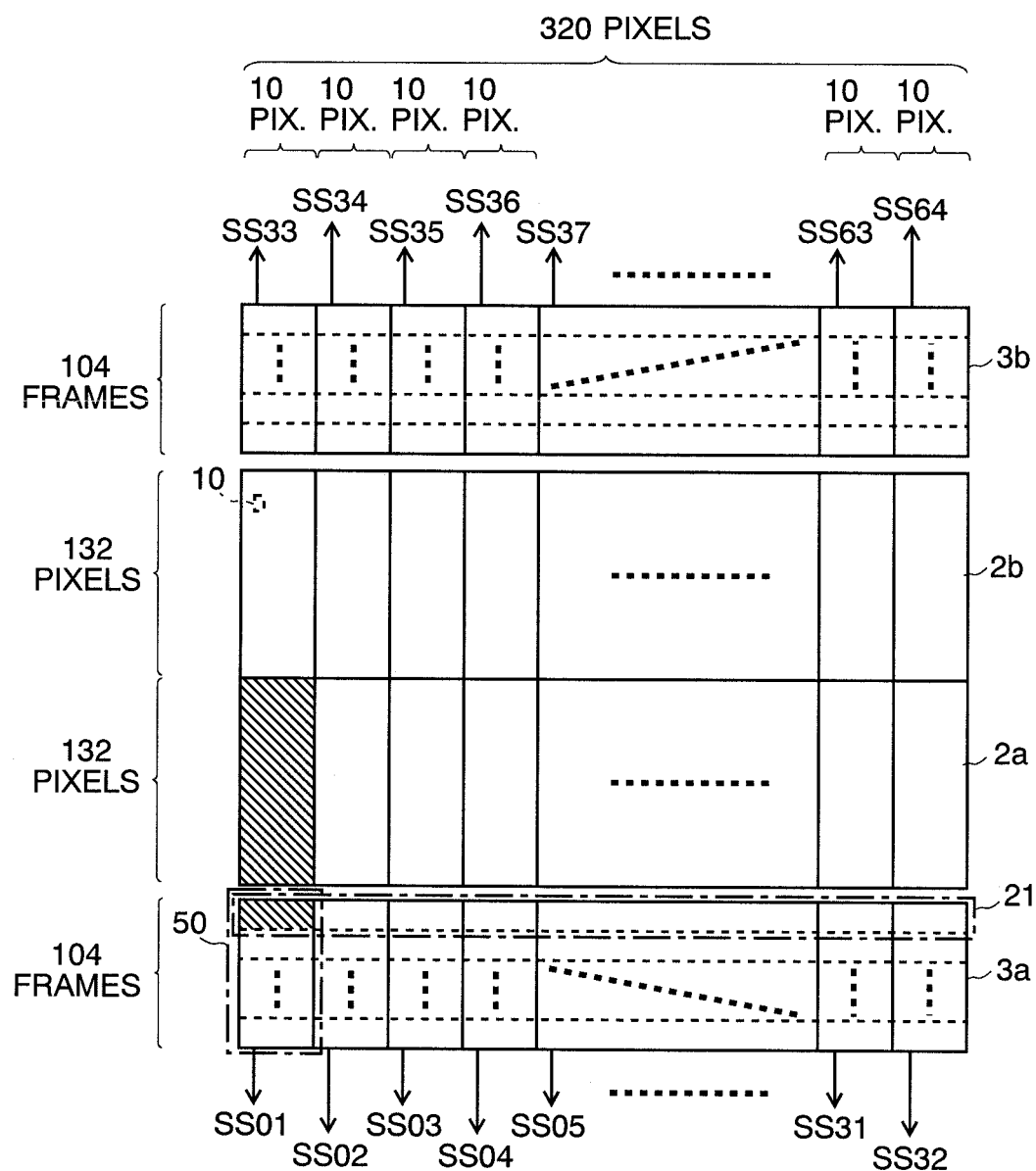
FIG. 3 is a plan view showing a schematic configuration of the pixel area and memory area in the solid-state image sensor of the present embodiment.
Figure 4:
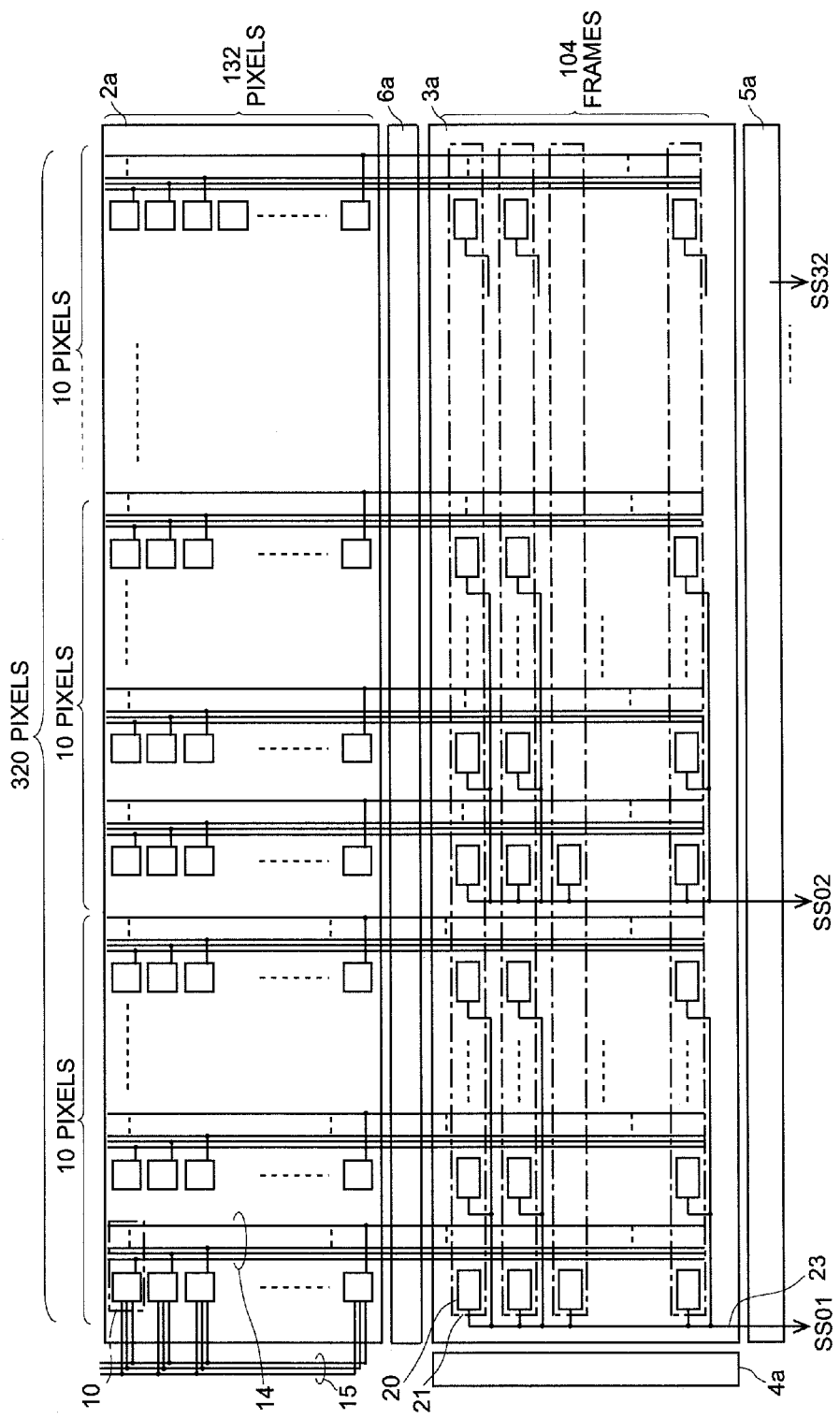
FIG. 4 is a block diagram of the main portion corresponding to approximately one half of the semiconductor chip of the solid-state image sensor of the present embodiment.

An overall configuration and structure of the solid-state image sensor according to the present embodiment is initially described. FIG. 1 is a schematic plan view showing the layout on a semiconductor chip of the solid-state image sensor of the present embodiment, FIG. 3 is a plan view showing a schematic configuration of the pixel area and memory area in the solid-state image sensor of the present embodiment, and FIG. 4 is a block diagram of the main portion corresponding to approximately one-half of the semiconductor chip of the solid-state image sensor of the present embodiment.

As shown in FIG. 1, in the present solid-state image sensor, the pixel area 2 (2a and 2b) for receiving light and producing signals for each pixel and the memory areas 3a and 3b for holding the signals for a predetermined number of frames are not intermixed but completely separated from each other on the semiconductor substrate 1 so that each area forms a definite block. Within the rectangular pixel area 2, a total of N×M pixels 10 consisting of N rows and M columns are arranged in a two-dimensional array. This pixel area 2 is divided into the first pixel area 2a and second pixel area 2b, each of which has (N/2)×M pixels arranged inside.

Below the first pixel area 2a, a first memory area 3a is provided across a first current source area 6a having a small area, while a second memory area 3b is provided above the second pixel area 2b across a second current source 6b which also has a small area. The first and second memory areas 3a and 3b each include a first or second vertical scan circuit area 4a or 4b and a first or second horizontal scan circuit area 5a or 5b, each circuit area being provided with circuits such as shift resisters and decoders for controlling the reading of signals from the memory area 3a or 3b. As shown in FIG. 3, each memory area 3a or 3b has 64 bundles of output lines SS01-SS64, including 32 bundles at each of the upper and lower ends, for reading signals to the outside of the sensor.

The solid-state image sensor of the present embodiment is nearly symmetrical with respect to a horizontal border line extending approximately through the center of the pixel area 2 to divide this area into upper and lower sections. The structure and operation of the upper and lower sections are basically identical. Therefore, the following description is mainly concerned with the structure and operation of the lower section, i.e. the first pixel area 2a, first memory area 3a, first vertical scan circuit area 4a and first horizontal scan circuit area 5a.

The number of pixels, i.e. the values of N and M, can be arbitrarily determined. Increasing these values improves the image resolution but also unfavorably results in either an increase in the entire chip area or a decrease in the chip area per one pixel. In the present example, N=264 and M=320. Accordingly, the total number of pixels arranged in each of the first and second pixel areas 2a and 2b is 42240, i.e. 320 pixels in the horizontal direction and 132 pixels in the vertical direction, as shown in FIGS. 3 and 4.

Figure 2:
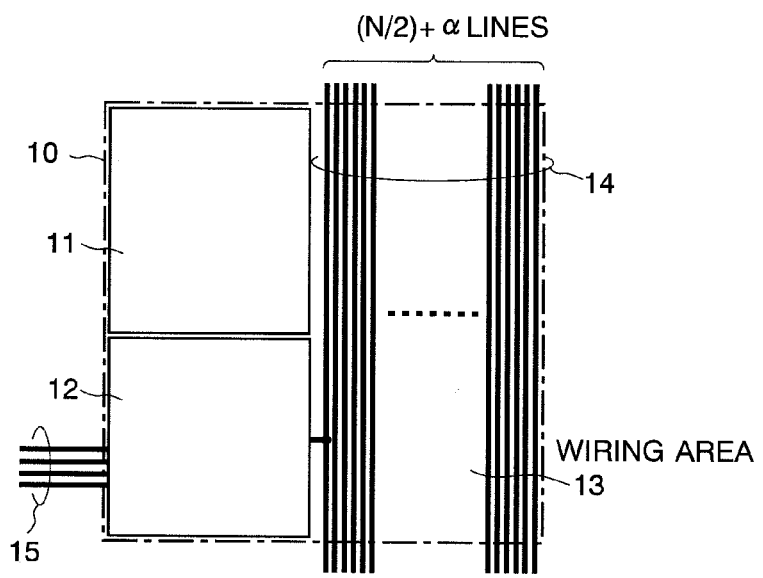
FIG. 2 is a schematic plan view showing the layout of one pixel within a pixel area in the solid-state image sensor of the present embodiment.

FIG. 2 is a schematic plan view showing the layout of one pixel 10 within the pixel area 2 (2a and 2b). One pixel 10 occupies roughly one square area, which is further divided into three areas, i.e. the photoelectric conversion area 11, pixel circuit area 12 and wiring area 13. In the wiring area 13, a bundle of vertically extending (N/2)+α pixel output lines 14 are provided. The value of α may be zero, in which case the number of pixel output lines passing through one wiring area 13 in the present example is 132. However, when a large number of wirings (e.g. aluminum wirings or other kinds of metal wirings) parallel to each other are created, the width of the wires on both ends as well as their parasitic capacitances normally tend to be different. To address these problems, a dummy wire is additionally provided at each end of the 132 pixel output lines which are used to actually pass the signals. In this case, α=2, so that the number of wires passing through one wiring area 13 is 134.

Figure 5:
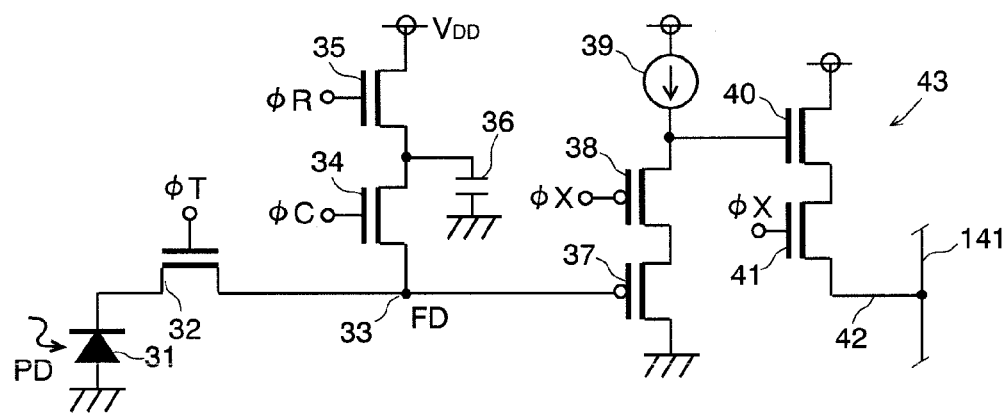
FIG. 5 is a circuit configuration diagram of one pixel in the solid-state image sensor of the present embodiment.

FIG. 5 is a circuit configuration diagram of one pixel 10 shown in FIG. 2. The pixel 10 includes the following elements: a power supply voltage VDD, a photodiode 31 for receiving light and producing photocharges; a transfer transistor 32, which is located near the photodiode 31, for transferring the photocharges; a floating diffusion (FD) 33, which is connected to the photodiode 31 via the transfer transistor 32, for temporarily storing the photocharges; a storage transistor 34 and storage capacitor 36 for storing charges overflowing from the photodiode 31 through the transfer transistor 32 in the process of storing photocharges; a reset transistor 35 for discharging the charges stored in the floating diffusion 33 and the storage capacitor 36; a source follower amplifier 43 with a two-stage configuration including a pair of cascade-connected PMOS transistors 37 and 38 and another pair of cascade-connected NMOS transistors 40 and 41, for extracting charges stored in the floating diffusion 33 or in both the floating diffusion 33 and the storage capacitor 36 to the outside as voltage signals (this amplifier corresponds to the buffer element in the present invention); and a current source 39, which consists of a constant-current transistor and other components, for supplying current to the transistors 37 and 38 in the first stage of the source follower amplifier 43.

Drive lines 15 for supplying control signals φT, φC, φR and φX are respectively connected to the gate terminals of the transfer transistor 32, storage transistor 34, reset transistor 35, and selection transistors 38 and 41 of the source follower amplifier 43. As shown in FIG. 4, these drive lines are common to all the pixels within the pixel area 2. This configuration enables simultaneous driving at all the pixels.

The output 42 of the transistor 41 in the second stage of the source follower amplifier 43 is connected to one of the 132 pixel output lines 14 (i.e. the pixel output line denoted by numeral 141 in FIG. 5) provided in the aforementioned wiring area 13. Such a pixel output line 141 is provided for every pixel 10, i.e. independently for each pixel 10. Therefore, the present solid-state image sensor has as many pixel output lines as the number of pixels, i.e. 84480.

The source follower amplifier 43 functions as a current buffer for driving the pixel output line 141 at high speeds. As shown in FIG. 4, each pixel output line 141 extends from the pixel area 2a to the memory area 3a and hence acts as a considerably large capacitive load. Driving such an element at high speeds requires a large-sized transistor through which high currents can be passed. However, in order to raise the photoelectric conversion gain in each pixel 10, the floating diffusion 33 for converting photocharges to voltage should preferably have the smallest possible capacitance. The parasitic capacitance of the gate terminal of the transistor connected to the floating diffusion 33 causes an effective increase in the capacitance of the floating diffusion 33. Therefore, for the aforementioned reason, this transistor 37 should preferably be a small-sized transistor with a small gate input capacitance. To fulfill both the supply of high current on the output side and the low capacitance on the input side, the source follower amplifier 43 in the present embodiment has a two-stage configuration, where a small-sized transistor is used as the transistor 37 in the first stage to reduce the input gate capacitance while large-sized transistors are used as the second-stage transistors 40 and 41 to ensure a high output current.

The selection transistor 38 in the first stage of the source follower amplifier 43 is not essential for the basic operation. However, when the second-stage selection transistor 41 is off, this selection transistor 38 can be simultaneously turned off to block the flow of current from the current source 39 into the transistor 37 and thereby suppress the consumption of electric power.

Figure 6:
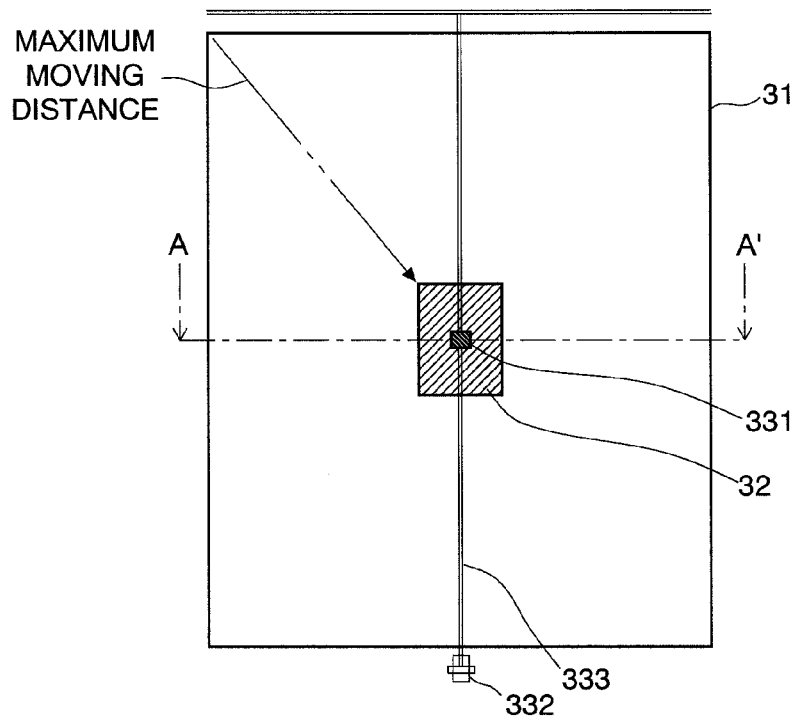
FIG. 6 is a schematic plan view showing the layout of a photoelectric conversion area in one pixel in the solid-state image sensor of the present embodiment.

FIG. 6 is a schematic plan view showing the layout of the photoelectric conversion area 11 in one pixel 10, FIG. 7 is a schematic vertical sectional view of the photoelectric conversion area 11 and other important elements, and FIG. 8 is a schematic potential diagram at the vertical section indicated by the arrowed line A-A' in FIG. 6.

The photodiode 31, which has a photo-receiving surface that is substantially rectangular when viewed from above, has an embedded photodiode structure. In high-speed imaging, the exposure time is extremely short. Therefore, to ensure appropriate exposure, the photodiode of each pixel 10 needs to have the largest possible photo-receiving surface so that it can receive the largest possible amount of incident light. However, increasing the area of the photo-receiving surface of the photodiode normally causes a problem relating to the time required for the photocharges to reach the floating diffusion, particularly for the photocharges produced in the circumferential portion of the photo-receiving surface. This problem can result in a situation where the photocharges that cannot be transferred during the short cyclic period of the high-speed imaging are eventually wasted or cause afterimages. To address these problems, the solid-state image sensor of the present embodiment has adopted a special structure, as hereafter described, to improve the charge-transfer speed.

As already stated, the floating diffusion is normally placed next to the photodiode. However, as shown in FIG. 6, the present solid-state image sensor has a small-sized floating diffusion 331 located nearly at the center of the photodiode 31, with the ring-shaped gate of the transfer transistor 32 encircling the floating diffusion 331 FIG. 7 shows one example, in which a p-well region 61 having a predetermined thickness is formed on an n-type silicon semiconductor substrate (n-sub) 60, and an n-type semiconductor region 62 is formed in the p-well region 61. A $p^+$-type semiconductor region 63 is formed on the surface of the n-type semiconductor region 62. This pn junction forms an embedded photodiode 31.

At the center of the photodiode 31, there is a blank area of the n-type semiconductor region 62, within which an $n^+$-type semiconductor region is formed on the surface layer of the p-well region 61. This $n^+$-type region functions as the floating diffusion region 331. Between the floating diffusion region 331 formed by the $n^+$-type semiconductor region and the surrounding n-type semiconductor region 62, a ring-shaped gate electrode made of polysilicon or other materials is created, via an insulator film on the surface layer, to form a transfer transistor 32. The provision of the floating diffusion 331 at the center of the photodiode 31 almost halves the maximum moving distance of the photocharges from the circumference of the photodiode 31 to the floating diffusion 331 as compared to the case where the floating diffusion is provided next to one end of the photodiode. Accordingly, the photocharges can reach the floating diffusion 331 within a shorter period of time irrespective of where they are generated within the circumferential portion of the photodiode 31. Therefore, even in the case where the period of time assigned to the photocharge storage process is short, there will be only a small amount of photocharges that cannot reach the floating diffusion 31.

Figure 19:
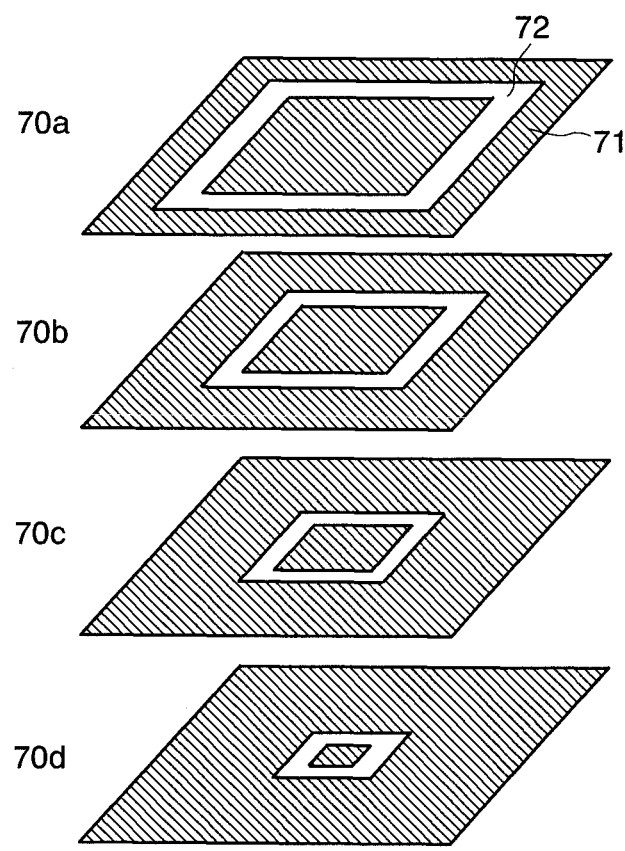
FIG. 19 is a schematic diagram of the photomasks used in the process of creating a photodiode in the solid-state image sensor of the present embodiment.

In the process of forming the $p^+$-type semiconductor region 61, n-type semiconductor region 62 or p-well region 61, the amount (or depth) of injection (doping) of impurities is changed in stages by using a plurality of photomasks 70a-70d differing in the layout of the shielding area 71 and passing area 72, as shown in FIG. 19. Subsequently, an annealing process is performed to appropriately diffuse the injected impurities so that the amount (or depth) of doping (or injection) gradually increases from the circumferential portion toward the center of the photodiode 31 (i.e. toward the floating diffusion 331). Therefore, when an appropriate bias voltage is applied to the pn junction of the photodiode 31, a potential gradient that is inclined downwards from the circumferential portion to the center of the photodiode 31 is created, as shown in FIG. 8(a).

The magnitude of the potential gradient can be determined as follows: Given that t denotes an allowable time for a photocharge to move through the photodiode 31, W denotes the maximum moving distance, μ denotes the degree of mobility of the charge, and E denotes an average internal field created within the photodiode 31 by the potential gradient, the values satisfy the condition of $t \leq W/(\mu \cdot E)$. Due to this intended potential gradient created by a skillfully devised process, a photocharge produced by incident light at a location closer to the circumference of the photodiode 31 is more rapidly accelerated toward the center.

In this process, when the transfer transistor 32 is off, the photocharges are collected around the potential barrier formed immediately below the ring-shaped gate electrode of the transfer transistor 32, as shown in FIG. 8(a). Then, when the transfer transistor 32 is turned on, the collected photocharges will immediately fall into the floating diffusion 331 through the transfer transistor 32, as shown in FIG. 8(b). On the other hand, if the transfer transistor 32 is maintained in the ON state while the light is being received, the photocharges that have gathered at the center along the potential gradient will directly fall into the floating diffusion 331 through the transfer transistor 32. In any of these cases, the photocharges produced by the photodiode 31 are promptly, and with high probability, transferred to the floating diffusion 331.

The provision of the floating diffusion 331 at the center of the photodiode 31 offers the previously described significant advantages. However, the previous configuration causes the problem that the aperture ratio will decrease if another element, such as a storage capacitor 36 for storing photocharges that have overflowed, is placed close to the floating diffusion 331. This problem is avoided in the present embodiment by providing a second floating diffusion 332 as an n+-semiconductor region within the pixel circuit area 12 in addition to the aforementioned floating diffusion 331 which photocharges directly flow into as described previously (this floating diffusion is hereinafter called the first floating diffusion), with a wire 333 made of aluminum or other kinds of metal connecting the first floating diffusion 331 and the second floating diffusion 332 to equalize their potential. This means that the first floating diffusion 331 and the second floating diffusion 332 integrally function as a floating diffusion 33 which serves as the detection node for converting electric charge signals into voltage signals.

Figure 20A:
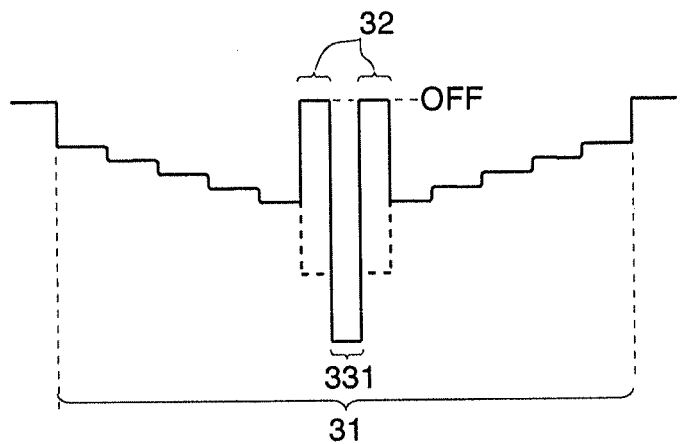
FIGS. 20(a) and 20(b) are schematic potential diagrams of the photodiode in a solid-state image sensor according to another embodiment of the present invention.
Figure 20B:
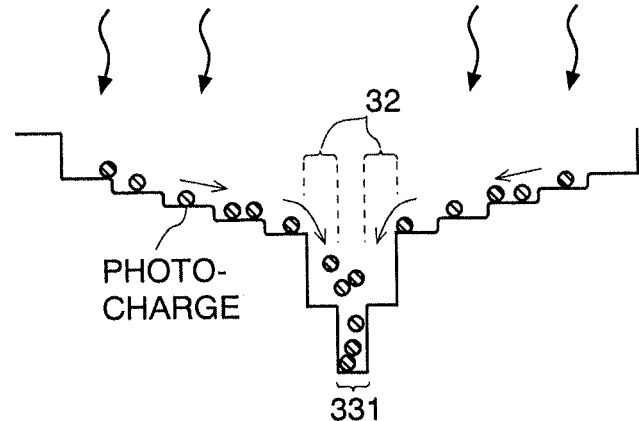
Figure 21:
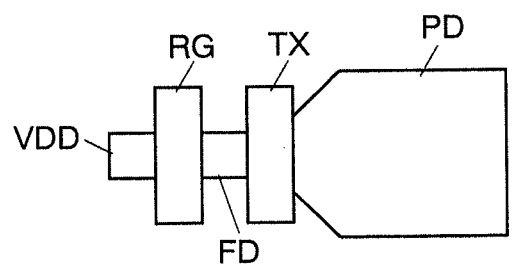
FIG. 21 is a plan view showing a pixel structure using a normal type of embedded photodiode.

As stated earlier, the potential of the photodiode 31 in the present embodiment has an inclined form. Alternatively, it is possible to create a step-like potential, for example as shown in FIG. 20. In this case, the photocharges produced by the photodiode 31 move toward the center while repeating the drifting and diffusing actions alternately. Thus, the photocharges will be efficiently transferred into the floating diffusion 331.

The internal configuration of the first and second memory areas 3a and 3b is hereinafter described in detail. As shown in FIG. 4, each of the first and second memory areas 3a and 3b includes memory section units 20 whose number equals the number L of storage frames. These memory section units 20 are arrayed in the extending direction of the 132 pixel output lines 14 which are respectively connected to the 132 pixels 10 vertically arranged within the pixel area 2a or 2b. In the present example, the number L of storage frames, or the number of frames for continuous imaging, is 104. Accordingly, 104 pieces of memory section units 20 are vertically arranged to form a column, and 320 copies of this column are arranged horizontally. Thus, the first memory area 3a has 104×320=33280 pieces of memory section units 20 arranged inside. The second memory area 3b also has the same number of memory section units 20.

Figure 9:
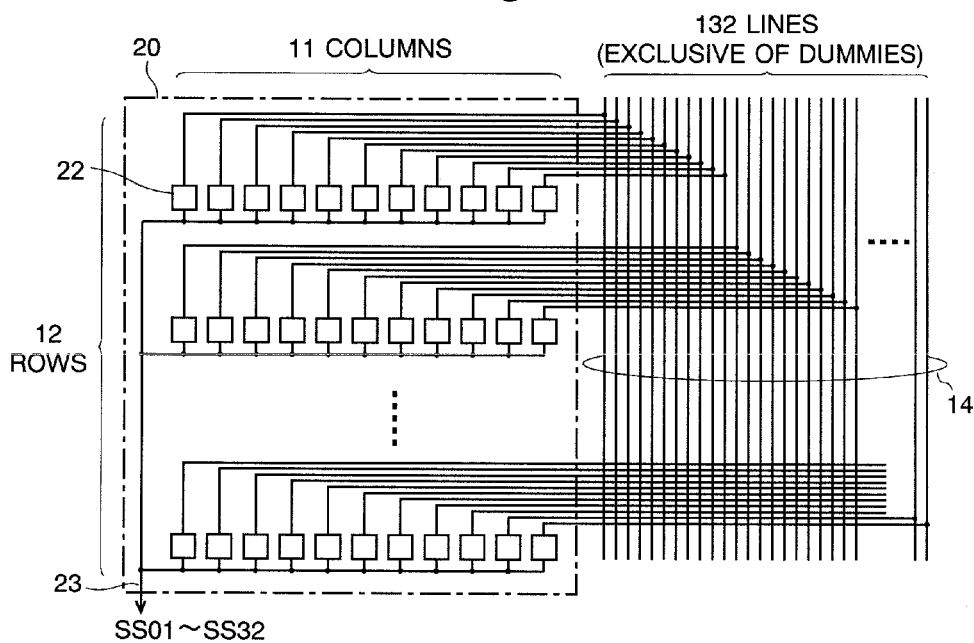
FIG. 9 is a schematic configuration diagram of one memory section unit corresponding to 132 pixels vertically arranged in the solid-state image sensor of the present embodiment.

FIG. 9 is a schematic diagram showing the internal configuration of one memory section unit 20. Each memory section unit 20 includes a total of 132 memory sections 22 forming an array with 12 rows and 11 columns. Each memory section 20 is connected to a different pixel output line 141. The pixel output lines 141 establish a one-to-one relation between the memory sections 22 and the pixels 10 within the pixel area 2a. The 132 memory sections 22 within one memory section unit 20 hold output signals received from the 132 pixels 10 forming one column within the pixel area 2a. Therefore, the 320 memory section units 20 forming one horizontal row in FIG. 4 (i.e. the row of memory section units denoted by numeral 21 in FIG. 4) hold the pixel signals of the lower half of one frame consisting of 320×132 pixels. Similarly, in the second memory area 3b located above in FIG. 3, the pixel signals of the upper half of one frame consisting of 320×132 pixels are held by 320 memory section units 20 forming one horizontal row. Combining those two sets of signals produces one frame of image. With the vertically arranged 104 rows of memory section units, the present device can hold 104 frames of pixels signals.

As shown in FIG. 9, all outputs of the 132 memory sections 22 in each memory section unit 20 are connected together to form a single output line 23. Furthermore, as shown in FIG. 4, the horizontally arranged memory section units 20 are divided into groups each consisting of ten neighboring memory section units 20. Thus, 32 groups of memory section units 20 are horizontally arranged, where the signal output lines 23 of the ten memory section units 20 in each group are connected together to form a single line. The signal output lines 23 of the vertically arranged 104 memory section units 20 are also connected together to form a single line. As a result, the outputs of 1040 memory section units 20 arrayed in 10 columns and 104 rows, or the outputs of 137280 memory sections 22 included in those memory section units 20, are connected together to form one signal output line 23 in the memory area 3a. In FIG. 3, a memory section unit block, which is a collection of the memory section units 20 sharing the same signal output line 23, is denoted by numeral 50. The configuration described to this point results in 32 signal output lines 23 extracted from the first memory area 3a and the same number of signal output lines 23 extracted from the second memory area 3b. The signals extracted through these signal output lines 23 are denoted by numerals SS01-SS64.

Figure 10:
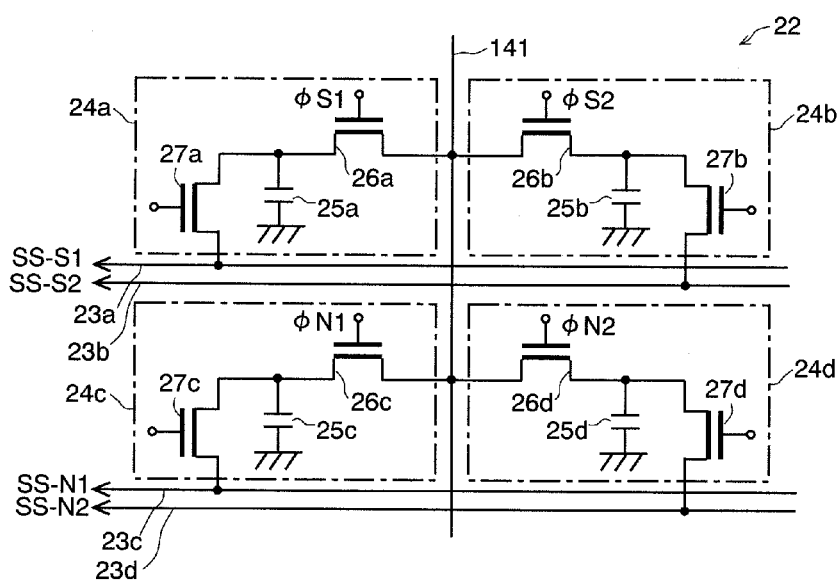
FIG. 10 is a circuit configuration diagram of one memory section in the solid-state image sensor of the present embodiment.

FIG. 10 is a circuit diagram of one memory section 22. One memory section 22 has four memory units. Each memory element 24 (24a-24d), which serves as a minimum memory unit, is composed of a sampling transistor 26 (26a-26d) connected to one pixel output line 141, a capacitor 25 (25a-25d) connected via the sampling transistor 26 to the pixel output line 141, and a reading transistor 27 (27a-27d) for reading an analogue voltage signal held in the capacitor 25. One memory section 22 consists of the combination of these four memory elements 24 (24a-24d). Accordingly, each memory section 22 can hold four different analogue voltage signals extracted from the same pixel through the same pixel output line 141. The signal output lines 23a, 23b, 23c and 23d via the four reading transistors 27a-27d are independent of each other. This means that the output line 23 shown in FIG. 8 actually consists of four lines, which are separately extracted for output.

This is to independently hold a signal corresponding to the charge before an overflow, a signal corresponding to the charge after an overflow, a noise signal contained in the signal corresponding to the charge before an overflow and a noise signal contained in the signal corresponding to the charge after an overflow, in order to perform a dynamic range increasing process, which will be described later. However, it is not always necessary to persist on this purpose; the memory elements 24a-24d can also be used in other operational modes. For example, if the storage capacitor 36 of each pixel 10 is not used, there is no need to consider the signal after an overflow and the noise signal contained in the signal after an overflow, in which case the corresponding memory elements 24 can be used to increase the number of frames for continuous imaging. As a result, the possible number of frames for continuous imaging will be doubled to 208. If the noise removal is also unnecessary, the possible number of frames for continuous imaging will be further doubled to 416.

Similar to the storage capacitor 36 in the pixel 10, the capacitors 25a-25d can be created, for example, by a double polysilicon gate structure or stack structure. Using a CCD structure to hold electric charges would cause the problem that an aliasing due to dark charges caused by thermal excitation or other factors would be added to the photo signal. The capacitors 25a-25d in the form of a double polysilicon gate structure or stack structure cause no such dark charges and hence no addition of aliasing, thus improving the S/N ratio of the signals to be extracted to the outside.

Figure 11:
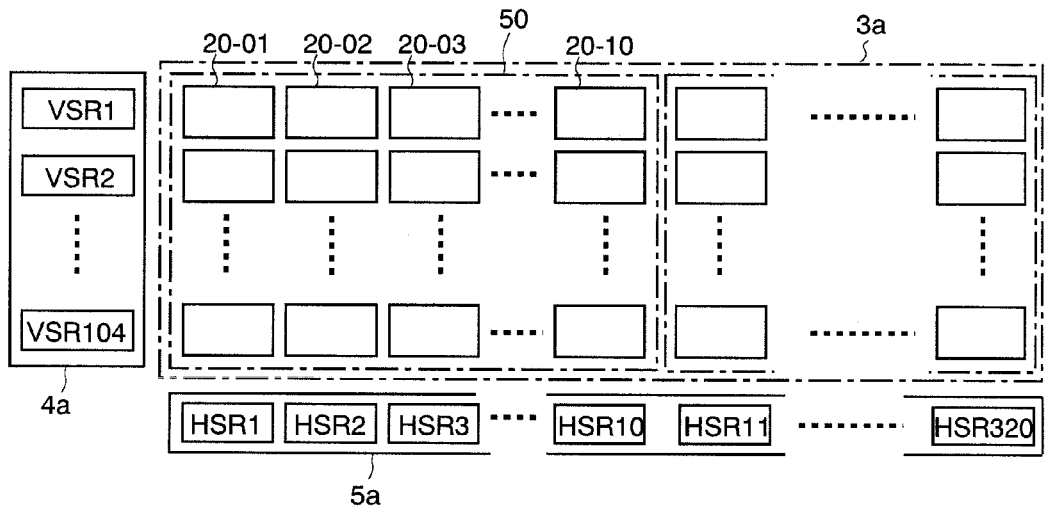
FIG. 11 is a block diagram showing a schematic configuration for reading signals held in the memory sections through output lines in the solid-state image sensor of the present embodiment.

FIG. 11 is a block diagram showing a schematic configuration for reading signals held in the memory sections within the memory area 3a through the previously described signal output line 23. There are horizontal shift registers HSR1-HSR320 provided for each vertical column of the memory section units 20 (20-01 to 20-10) arranged in a two-dimensional array, and vertical shift registers VSR1-VSR104 provided for each horizontal row. In a sequential reading, one memory section unit 20 is selected by a combination of the horizontal shift registers HSR1-HSR320 and vertical shift registers VSR1-VSR104. Within the selected memory section unit 20, the memory sections 22 are sequentially selected to extract pixel signals one after another.

An operation of continuously taking images at a high speed using the solid-state image sensor of the present embodiment is hereinafter described, where the process from the photoelectric conversion in each pixel 10 through the storage of the resultant signal in one memory section 22 is initially described with reference to FIGS. 12 to 15.

The solid-state image sensor of the present invention offers two different options for the drive mode: one drive mode is for a short photocharge storage time and the other for a relatively long photocharge storage time. As a rough guide, the former mode is suitable for a photocharge storage time shorter than a range from 10 to 100 μsec, i.e. in the case where the amount of dark charges that generates in the transfer transistor 32 is negligible. This drive mode can be preferably used when the imaging is performed at a high rate of one million frames per second or higher.

(A) Drive Mode for Short Photocharge Storage Time

Figure 12:
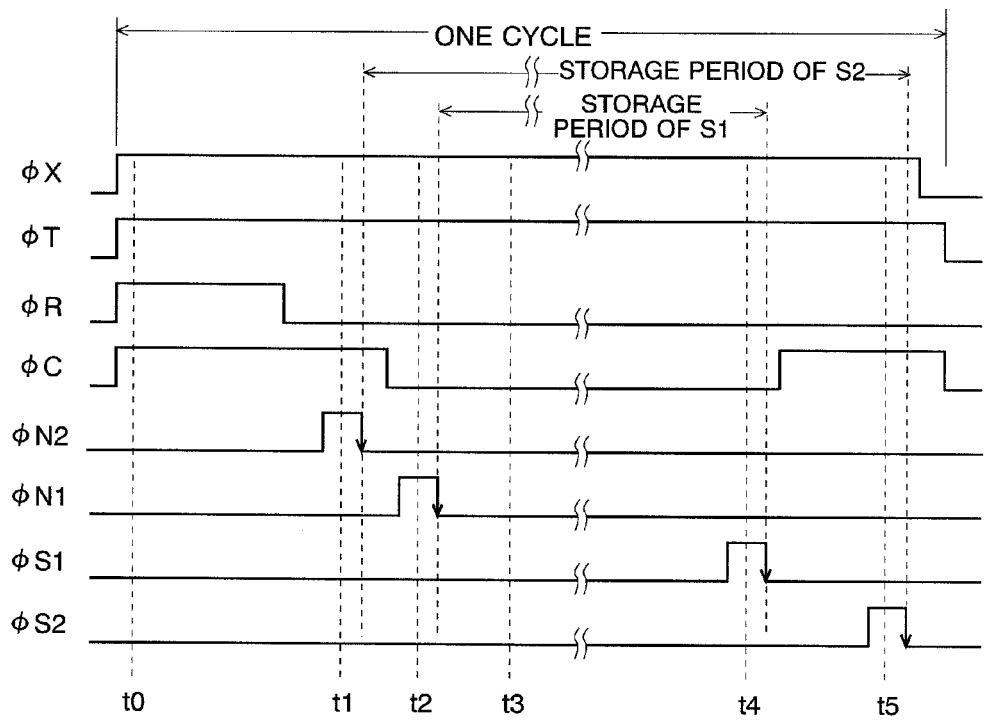
FIG. 12 is a timing chart of an operation mode of the solid-state image sensor of the present embodiment in the case where the photocharge storage time is short.
Figure 13:
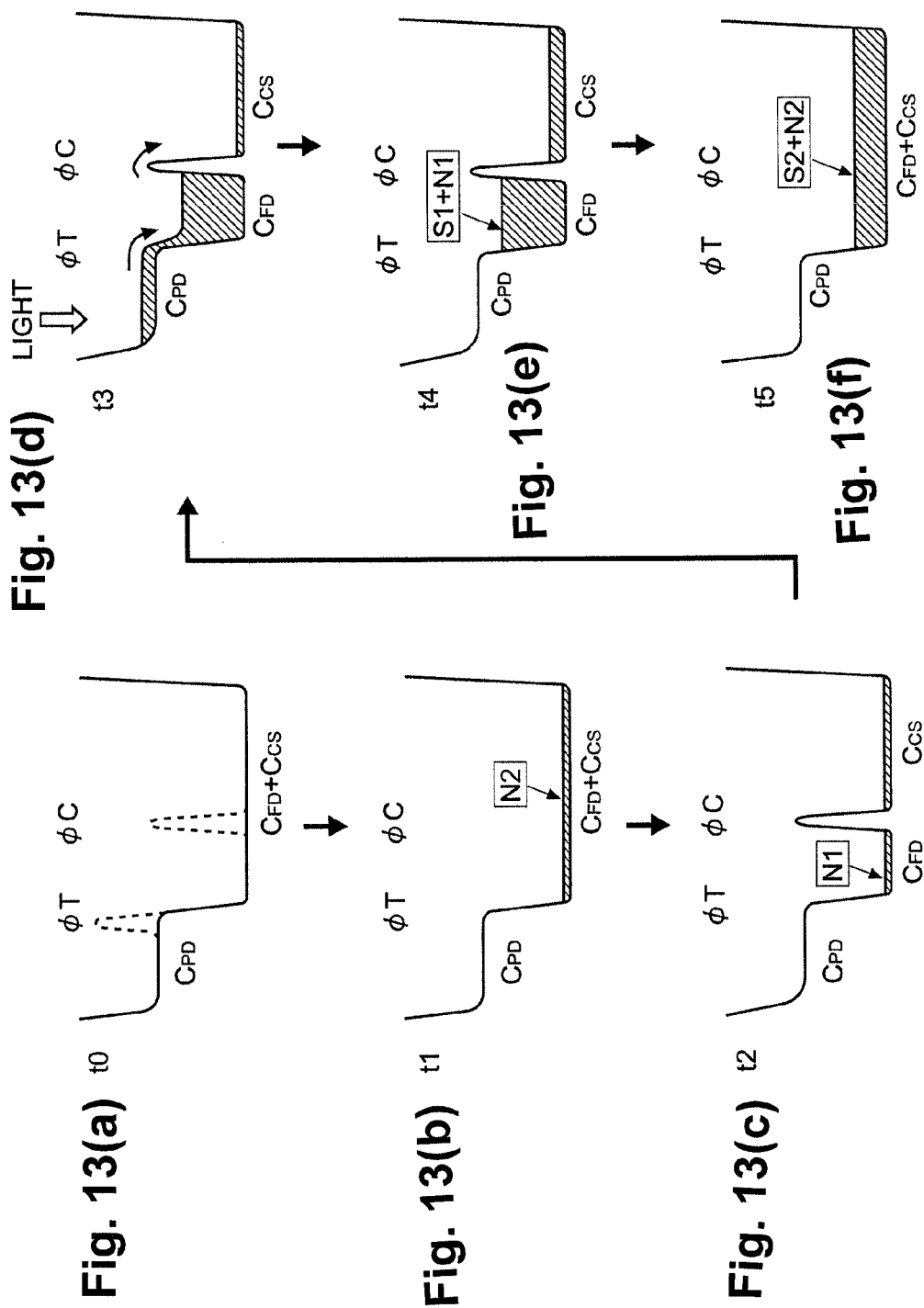
FIGS. 13(a) to 13(f) are schematic potential diagrams inside each pixel during the operation shown in FIG. 12.

FIG. 12 is a drive timing chart of the operation mode for a short photocharge storage time, and FIG. 13 is a schematic potential diagram inside each pixel 10 during this drive mode. In FIG. 13 (and in FIG. 15 to be mentioned), $C_{PD}$, $C_{FD}$ and $C_{CS}$ denote the capacitances of the photodiode 31, floating diffusion 33 and storage capacitor 36, respectively, and $C_{FD}$+$C_{CS}$ denotes the combined capacitance of the floating diffusion 33 and storage capacitor 36.

In this case, the signal φX, which is a common control signal supplied to every pixel 10, is set to a high level to maintain both the selection transistors 38 and 41 within the source follower amplifier 43 in the ON state. Before the photocharge storage is performed, the signals φT, φC and φR, which are also common control signals, are set to a high level to turn on the transfer transistor 32, storage transistor 34 and reset transistor 35 (time t0), whereby the floating diffusion 33 and storage capacitor 36 are reset (or initialized). At this point in time, the photodiode 31 is completely depleted. The potential at this point in time is shown in FIG. 13(*a*).

Next, φR is set to a low level to turn off the reset transistor 35, whereupon a noise signal N2, which equivalently contains a random noise generating in the floating diffusion 33 and storage capacitor 36 and a fixed pattern noise resulting from a variation in the threshold voltage of the transistor 37 in the source follower amplifier 43, is generated in the floating diffusion 33 (refer to FIG. 13(*b*)), and an output current corresponding to this noise signal N2 flows through the pixel output line 141. At this timing (time t1), a sampling pulse φN2 is given to the memory section 22 to turn on the sampling transistor 26*d* so that the noise signal N2 outputted through the pixel output line 141 is held by the capacitor 25*d*.

Subsequently, φC is set to the low level to turn off the storage transistor 34, whereupon the signals stored in the floating diffusion 33 and storage capacitor 36 at this point in time are distributed to the floating diffusion 33 and the storage capacitor 36 according to the ratio of their capacitances $C_{FD}$ and $C_{CS}$ (refer to FIG. 13(*c*)). In this state, a noise signal N1, which contains a random noise generated when φC was turned off and a fixed pattern noise resulting from a variation in the threshold voltage of the transistor 37 in the source follower amplifier 43, is generated in the floating diffusion 33, and an output current corresponding to this noise signal N1 flows through the pixel output line 141. At this timing (time t2), a sampling pulse φN1 is given to the memory section 22 to turn on the sampling transistor 26*c* so that the noise signal N1 outputted through the pixel output line 141 is held by the capacitor 25*c*.

Since the transfer transistor 32 is maintained in the ON state, the photocharges generated by light falling onto the photodiode 31 flow through the transfer transistor 32 (this state is shown in FIG. 8(*b*)) into the floating diffusion 33, and are stored in the floating diffusion 33, being superimposed on the noise signal N1 (time t3). If the floating diffusion 33 is saturated due to a large amount of photocharges produced in the photodiode 31 by strong incident light, the overflowing charges are stored through the storage transistor 34 into the storage capacitor 36 (refer to FIG. 13(*d*)). Setting the threshold voltage of the storage transistor 34 at an appropriately low level enables those charges to be efficiently transferred from the floating diffusion 33 to the storage capacitor 36. By this method, it is possible to effectively utilize the saturated charges without discarding them even if the floating diffusion 33 has a small capacitance $C_{FD}$ and can store only a small amount of charges in the maximally saturated state. In this manner, both the charges produced before charge saturation (overflow) at the floating diffusion 33 and those produced after charge saturation (overflow) can be utilized as output signals.

After a predetermined photocharge storage time (exposure time) has elapsed, a sampling pulse φS1 is given to the memory section 22, with the storage transistor 34 in the OFF state, to turn on the sampling transistor 26*a*, whereby a signal corresponding to the charge stored in the floating diffusion 33 at that point in time (time t4) is extracted through the pixel output line 141 and held in the capacitor 25*a* (refer to FIG. 13(*e*)). The signal stored in the floating diffusion 33 at this point in time results from the superposition of a noise signal N1 and a signal S1 corresponding to the charge before an overflow. Accordingly, the signal held in the capacitor 25*a* equals S1+N1, which does not reflect the amount of charge stored in the storage capacitor 36.

Immediately after that, φC is set to the high level to turn on the storage transistor 34, whereupon the charge held in the floating diffusion 33 at that point in time is mixed with the charge held in the storage capacitor 36 (refer to FIG. 13(*f*)). In this state, a sampling pulse φS2 is given to the memory section 22 to turn on the sampling transistor 26*b* (time t5), whereby a signal corresponding to the charges held in the floating diffusion 33 and the storage capacitor 36, i.e. a signal resulting from the superposition of the noise signal N2 and the signal S2 corresponding to the charge after the overflow, is extracted through the pixel output line 141 and held in the capacitor 25*b*. Accordingly, the signal to be held in the capacitor 25*b* is S2+N2, which reflects the amount of charge stored in the storage capacitor 36.

By the process described to this point, the signals S1+N1, S2+N2, N1 and N2 are respectively held in the four capacitors 25*a*, 25*b*, 25*c* and 25*d* included in one memory section 22. Thus, one cycle of the image signal acquisition operation is completed. As already explained, the noise signals N1 and N2 containing the random noise and fixed pattern noise are obtained separately from the other signals containing these noise signals. These signals can be respectively read from the capacitors 25*a*, 25*b*, 25*c* and 25*d* and then subjected to a subtracting operation to obtain high S/N image signals free from the influence of the noise signals N1 and N2. Since the charges that have overflowed from the floating diffusion 33 are not discarded but utilized, even a strong incident light barely causes saturation, so that the resultant signal can reflect the light. Thus, a wide dynamic range is ensured. The possibilities of widening the dynamic range in this manner are described in detail in the Japanese Unexamined Patent Application Publication No. 2006-245522 and other documents. Therefore, no explanation will be made in this specification.

(B) Operation Mode for Relatively Long Exposure Charge-Storage Time

Figure 14:
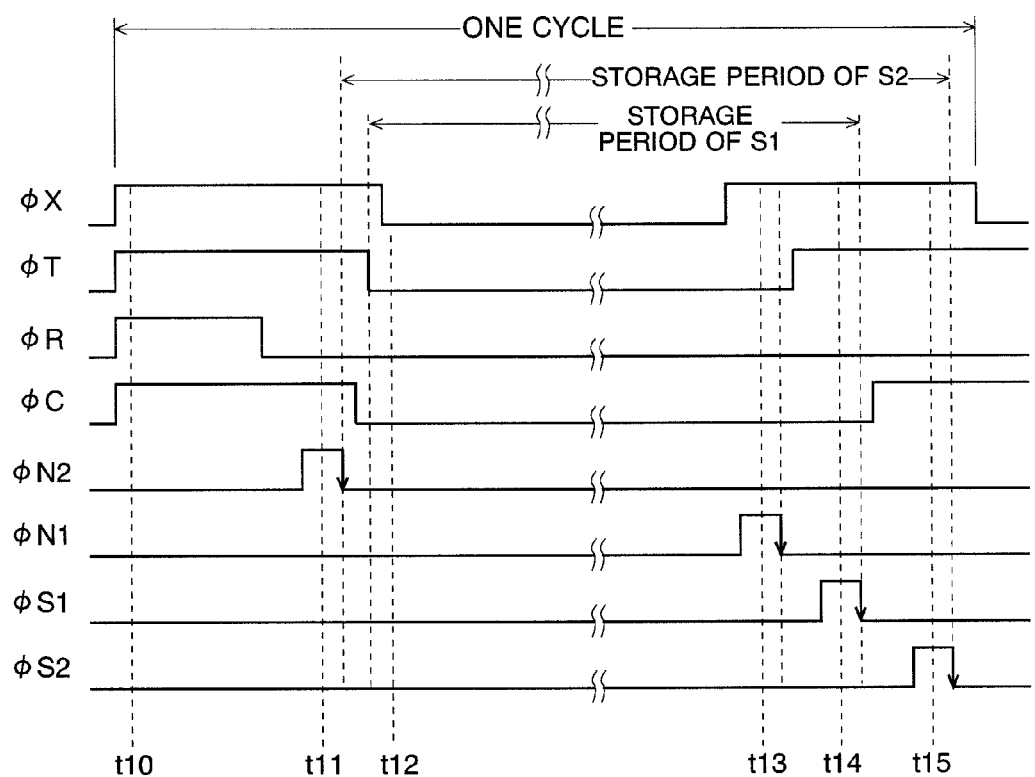
FIG. 14 is a timing chart of an operation mode of the solid-state image sensor of the present embodiment in the case where the photocharge storage time is relatively long.
Figure 15:
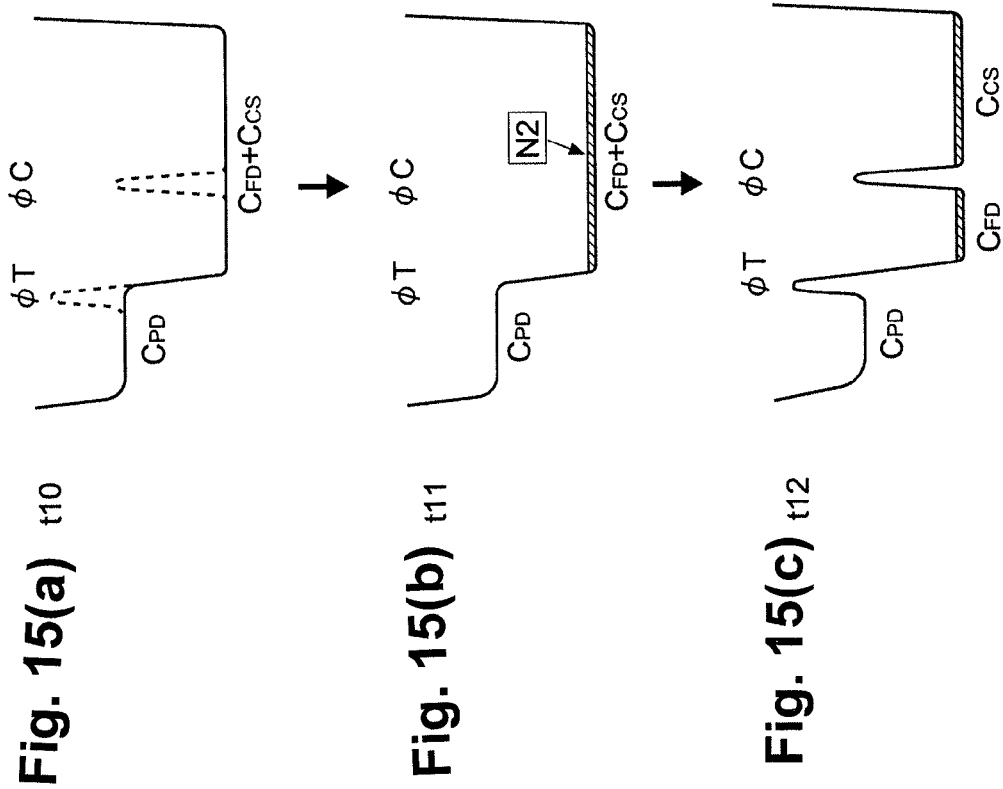
FIGS. 15(a) to 15(f) are schematic potential diagrams inside a pixel during the operation shown in FIG. 14.

An operation for a relatively long photocharge storage time is hereinafter described. FIG. 14 is a drive timing chart in the case where the photocharge storage time is relatively long, and FIG. 15 is a schematic potential diagram inside the pixel in this operation.

The most significant difference from the case of the short photocharge storage time exists in many points. For example, the transfer transistor 32 is turned off during the photocharge storage period so that the photocharges produced in the photodiode 31 will be stored in a depletion layer; the transfer transistor 32 is turned off during the photocharge storage period; and the sampling of the noise signal N1 is performed at the end of the photocharge storage period so that the dark charges (and photocharges) that generate in the floating diffusion 33 will not be included in the signal S1. The purpose of turning off the transfer transistor 32 is to create an accumulation state at the interface between the silicon and insulating film immediately below its gate, thus filling the silicon surface with holes to prevent intrusion of dark charges through the interface between the silicon and insulating film. Another difference is that, taking into account the long photocharge storage time, the selection transistors 38 and 41 of the source follower amplifier 43 are turned off for a predetermined period of time to reduce the power consumption.

Before the photocharge storage is performed, $\phi T$, $\phi C$ and $\phi R$ are set to high levels to turn on both the storage transistor 34 and reset transistor 35 (time t10), whereby the floating diffusion 33 and storage capacitor 36 are reset (or initialized). At this point in time, the photodiode 31 is completely depleted. The state of potential at this point in time is shown in FIG. 15(a).

Next, $\phi R$ is set to the low level to turn off the reset transistor 35, whereupon a noise signal N2, which equivalently contains a random noise generating in the floating diffusion 33 and the storage capacitor 36 and a fixed pattern noise resulting from a variation in the threshold voltage of the transistor 37 in the source follower amplifier 43, is generated in the floating diffusion 33 (refer to FIG. 15(b)), and an output current corresponding to this noise signal N2 flows through the pixel output line 141. At this timing (time t11), a sampling pulse $\phi N2$ is given to the memory section 22 to turn on the sampling transistor 26d, whereby the noise signal N2 is extracted through the pixel output line 141 and held in the capacitor 25d. The operations to this point are identical to those of the previously described operation mode for a short photocharge storage time.

Next, $\phi C$ is set to the low level to turn off the storage transistor 34, whereupon the signal charges stored in the floating diffusion 33 and storage capacitor 36 at this point in time are distributed to the floating diffusion 33 and storage capacitor 36 according to the ratio of their capacitances $C_{FD}$ and $C_{CS}$. Furthermore, $\phi T$ is set to the low level to turn off the transfer transistor 32, and $\phi X$ is also set to the low level to turn off the two selection transistors 38 and 41 of the source follower amplifier 43 (time t12). As a result, a potential barrier is formed between the photodiode 31 and the floating diffusion 33, creating a condition where photocharges can be stored in the photodiode 31 (refer to FIG. 15(c)).

The photocharges produced by incident light falling onto the photodiode 31 are stored in the capacitance $C_{FD}$ of the photodiode 31. When a saturation occurs in the photodiode 31, excessive charges flow through the transfer transistor 32, to be stored in the floating diffusion 33 and superimposed on the noise signal that has been distributed as described previously. If the floating diffusion 33 is saturated by stronger incident light, the charges will be stored through the storage transistor 34 into the storage capacitor 36 (refer to FIG. 15(d)).

Setting the threshold voltage of the storage transistor 34 at a level appropriately lower than that of the transfer transistor 32 enables the charges saturated in the floating diffusion 33 to be efficiently transferred from the floating diffusion 33 to the storage capacitor 36 without being returned to the photodiode 31. By this method, it is possible to effectively use the saturated charges without discarding them even if the floating diffusion 33 has a small capacitance $C_{FD}$ and can store only a small amount of charges. In this manner, both the charges produced before the overflow at the floating diffusion 33 and those produced after the overflow can be utilized as output signals.

After a predetermined photocharge storage time has elapsed, $\phi X$ is set to the high level to turn on the selection transistors 38 and 41, after which a sampling pulse $\phi N1$ is given to the memory section 22 to turn on the sampling transistor 26c, whereby a noise signal N1 corresponding to the signal charge stored in the floating diffusion 33 at this point in time (time t13) is extracted through the pixel output line 14 and held in the capacitor 25c. The noise signal N1 at this point in time contains a fixed pattern noise due to a variation in the threshold voltage of the transistor 37 in the source follower amplifier 43.

Next, $\phi T$ is set to the high level to turn on the transfer transistor 32, whereupon the photocharges stored in the photodiode 31 are completely transferred to the floating diffusion 33 (refer to FIG. 15(e)). Immediately after that (time t14), a sampling pulse $\phi S1$ is given to the memory section 22 to turn on the sampling transistor 26a, whereby a signal corresponding to the charge stored in the floating diffusion 33 is extracted through the pixel output line 14 and held in the capacitor 25a. This signal results from the superposition of the aforementioned noise signal N1 and the signal corresponding to the charge stored in the photodiode 31, i.e. the signal S1 before the overflow, and hence equals S1+N1.

Subsequently, $\phi C$ is set to the high level to turn on the storage transistor 34, whereupon the charge held in the floating diffusion 33 at that point in time is mixed with the charge held in the storage capacitor 36 (refer to FIG. 15(f)). In this state, a sampling pulse $\phi S2$ is given to the memory section 22 to turn on the sampling transistor 26b (time t15), whereby a signal corresponding to the charges held in the floating diffusion 33 and storage capacitor 36 are extracted through the pixel output line 141 and held in the capacitor 25b. This signal equals S2+N2.

As a result of the processes described to this point, the signals S1+N1, S2+N2, N1 and N2 are respectively held in the four capacitors 25a, 25b, 25c and 25d included in one memory section 22. Thus, one cycle of image signal acquisition is completed. As in the case of the operation mode for the short photocharge storage time, the noise signals N1 and N2 containing the random noise and fixed pattern noise are obtained separately from the other signals containing these noise signals. These signals can be respectively read from the capacitors 25a, 25b, 25c and 25d and then subjected to subtraction to obtain high S/N image signals free from the influence of the noise signals N1 and N2. Since the charges that have overflowed from the floating diffusion 33 are not discarded but utilized, even a strong incident light barely causes saturation, so that the resultant signal can reflect the light. Thus, a wide dynamic range is ensured.

As described previously, the control signals φX, φT, φR and φC supplied to each pixel 10 are common to all the pixels. Therefore, the aforementioned operations of storing photocharges and transferring signals from each pixel 10 to the memory section 22 are simultaneously performed at all the pixels 10. That is, by one cycle of these operations, one frame of image signals are held in the 320 memory sections 22 horizontally arranged in the memory area 3*a* shown in FIG. 3. The operations are repeated 104 cycles to store the image signals in the memory sections 22 in all the memory section units 20. In the 105$^{th}$ and subsequent cycles, the operation of writing signals in the memory sections 22 is once more initiated from the topmost memory section units 20. Thus, the signal-holding operation is cyclically carried out. This process is continued, for example, until a command signal for discontinuing the imaging is externally given. When the command signal for discontinuing the imaging is given and the imaging is thereby discontinued, the latest 104 frames of image signals are held in the memory areas 3*a* and 3*b*.

When, as described previously, new signals are to be held in the capacitors 25 of a memory section 22 in which some signals are already present, it is necessary to reset the capacitors in order to discard those older signals. For this purpose, though not shown in the figures, a transistor for resetting is connected to each pixel output line 141. To reset the capacitor 25 of a given memory section 22, the sampling transistor 26 of the memory section 22 is turned on and, simultaneously, the transistor for resetting connected to the corresponding pixel output line 141 is turned on, whereby the signal stored in the capacitor 25 is reset through the sampling transistor 26 and the pixel output line 141. After this resetting operation is performed, a new signal is held in the capacitor 25.

The signals held in the capacitors 25 of each memory section 22 are read by sequentially turning on the reading transistors 27 connected to the same signal output line 23. Since the four reading transistors 27*a*-27*d* of the same memory section 22 are respectively connected to the different signal output lines 23*a*-23*d*, the signals held in each of the four capacitors 25*a*-25*d* in the same memory section 22 can be simultaneously read. Using these signals, the subtracting operations of (S1+N1)−N1 and (S2+N2)−N2 can be performed by a subtraction circuit (now shown) provided inside or outside the sensor to extract each of the signals S1 and S2 free from the random noise and fixed pattern noise. Which of S1 and S2 should be used is determined with reference to an appropriate signal level (threshold value) equal to or lower than the saturation level of the signal S1; S1 is selected when the signal is equal to or higher than the reference level, and S2 when the signal is lower than the reference level. By performing this selection below the signal saturation level, it is possible to avoid the influence of saturation variation of the signal S1.

Figure 16:
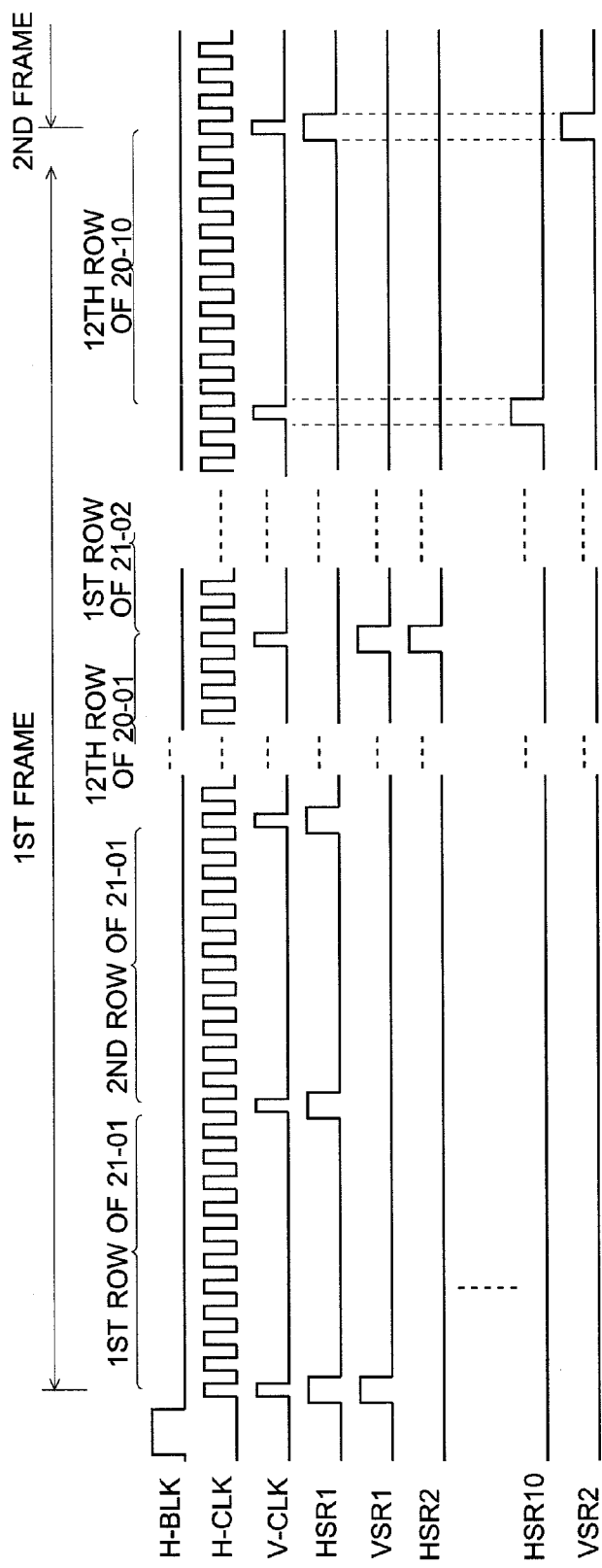
FIG. 16 is an operation timing chart of an operation of sequentially reading pixel signals in the solid-state image sensor of the present embodiment.
Figure 17:
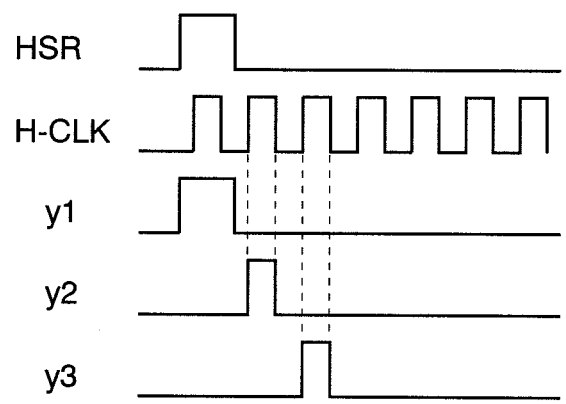
FIG. 17 is an operation timing chart of the main portion of the horizontal shift registers in the solid-state image sensor of the present embodiment.
Figure 18:
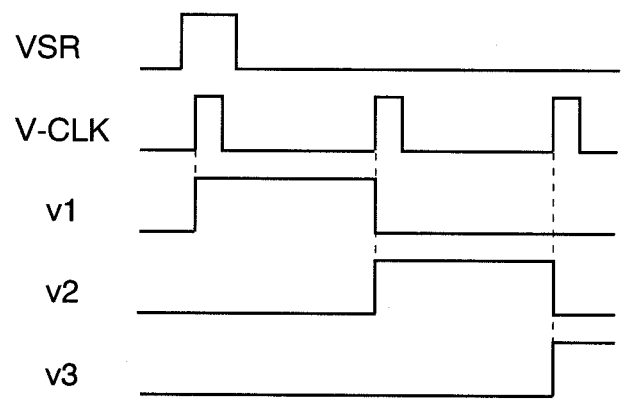
FIG. 18 is an operation timing chart of the main portion of the vertical shift registers in the solid-state image sensor of the present embodiment.

Next, an operation of sequentially reading signals from the memory areas 3*a* and 3*b* is described with reference to FIGS. 16 to 18. FIG. 16 is an operation timing chart of sequential reading of the signals from the memory areas 3*a* and 3*b*, FIG. 17 is an operation timing chart of the main portion of the horizontal shift registers HSR, and FIG. 18 an operation timing chart of the main portion of the vertical shift registers VSR.

As one example, the reading order at the leftmost memory section unit block 50 in the 320 memory section units 20 corresponding to the first frame in FIG. 11 is hereinafter described. In the leftmost memory section unit 20-01, image signals of eleven pixels are sequentially read from the memory sections 22 in the left-to-right direction of the first horizontal row shown in FIG. 9. This memory section unit 20-01 is selected by activating the horizontal shift register HSR1 and vertical shift register VSH1. The horizontal reading clock H-CLK produces a moving pulse signal that turns on the reading transistors 27 of the memory sections 22, one by one, from left to right in the horizontal direction. The signals y1, y2 and y3 in FIG. 17 are one example of this pulse signal. After the reading of one row is completed, a clock V-CLK for shifting the vertical reading position is supplied, whereby the memory sections 22 in the next (second) row are selected. Then, these memory sections 22 are similarly selected, from left to right, for the reading of eleven pixels. Such a process of reading pixel signals is repeated until the end of the twelfth row. The signals v1, v2 and v3 shown in FIG. 18 are one example of the signal for activating the reading transistor 27 corresponding to each row in the vertical direction.

Subsequently, the horizontal shift register HSR2 and vertical shift register VSR1 are activated to select the memory section unit 20-02 on the right, and this memory section unit 20-02 becomes the target of reading, as shown in FIG. 16. Then, as in the previous case, the signals are read by turning on the reading transistors 27 of each memory section 22, for one pixel after another, in the order of row→column. The sequential selection of each memory section unit 20 is continued until the memory section unit 20-10. When the reading of the memory sections 22 in the twelfth row of the memory section unit 20-10 is ended, the reading process for one frame is completed. Concurrently, in the other memory section unit blocks 50, the operation of reading signals from the memory sections of the corresponding memory section units is similarly performed.

After the pixel signals of the first frame have been entirely read in the previously described manner, the reading of pixel signals of the second frame is subsequently initiated. That is, the horizontal shift register HSR1 and the vertical shift register VSR2 are activated to select the leftmost memory section unit of the second row shown in FIG. 11, and the reading operation is performed in the same order as in the case of the first frame. This process is repeated to perform the reading operation through the end of the 104$^{th}$ frame. It should be noted that the reading process is not specifically limited to this one; it can be appropriately modified.

As described to this point, the solid-state image sensor of the present embodiment can rapidly and efficiently transfer photocharges to the floating diffusion 33 while allowing the use of a large-sized photodiode 31 to receive a larger amount of light. Therefore, even if, as in the case of a continuous high-speed imaging operation, the exposure time per one frame is short, the detection sensitivity and S/N ratio will be improved, so that the resultant images will have better qualities.

It should be noted that the foregoing embodiments are mere examples of the solid-state image sensor and its production method according to the present invention; any change, modification or addition that is appropriately made within the spirit of the present invention naturally falls within the scope of the claims of the present patent application.

The invention claimed is:
1. A solid-state image sensor, comprising:
a plurality of pixels arranged thereon, each of the pixels comprising
a photodiode for receiving light and producing photocharges,
a floating region comprising a first region formed at a center of a light-receiving portion of the photodiode and a second region which is electrically connected to the first region and formed outside the light-receiving portion of the photodiode, and a transfer transistor having a gate surrounding the first region of the floating region.

2. The solid-state image sensor according to claim 1, which is characterized in that a potential is changed from a circumferential portion of the light-receiving surface toward the central portion thereof so that the photocharges produced by the photodiode are moved toward the central portion of the light-receiving surface.

3. The solid-state image sensor according to claim 2, which is characterized in that a concentration and/or depth of an impurity injected in a substrate is changed in an inclined form from the circumferential portion of the light-receiving surface of the photodiode to the central portion thereof.

4. A method of producing the solid-state image sensor according to claim 3, which is characterized in that the potential is changed from the circumferential portion of the light-receiving surface of the photodiode toward the central portion thereof by changing a depth of injection of an impurity ion into a substrate by using a plurality of photomasks.

5. A method of producing the solid-state image sensor according to claim 3, which is characterized in that the potential is changed from the circumferential portion of the light-receiving surface of the photodiode toward the central portion thereof by changing an amount of injection of an impurity ion into a substrate by using a plurality of photomasks.

6. The solid-state image sensor according to claim 2, which is characterized in that a concentration and/or depth of an impurity injected in a substrate is changed in a step-like form from the circumferential portion of the light-receiving surface of the photodiode to the central portion thereof.

7. A method of producing the solid-state image sensor according to claim 6, which is characterized in that the potential is changed from the circumferential portion of the light-receiving surface of the photodiode toward the central portion thereof by changing a depth of injection of an impurity ion into a substrate by using a plurality of photomasks.

8. A method of producing the solid-state image sensor according to claim 6, which is characterized in that the potential is changed from the circumferential portion of the light-receiving surface of the photodiode toward the central portion thereof by changing an amount of injection of an impurity ion into a substrate by using a plurality of photomasks.

9. A method of producing the solid-state image sensor according to claim 2, which is characterized in that the potential is changed from the circumferential portion of the light-receiving surface of the photodiode toward the central portion thereof by changing a depth of injection of an impurity ion into a substrate by using a plurality of photomasks.

10. A method of producing the solid-state image sensor according to claim 2, which is characterized in that the potential is changed from the circumferential portion of the light-receiving surface of the photodiode toward the central portion thereof by changing an amount of injection of an impurity ion into a substrate by using a plurality of photomasks.

11. The solid-state image sensor according to claim 1, wherein the second region is not enclosed by the light-receiving portion of the photodiode.

* * * * *

UNITED STATES PATENT AND TRADEMARK OFFICE
CERTIFICATE OF CORRECTION

PATENT NO. : 8,569,805 B2
APPLICATION NO. : 12/676520
DATED : October 29, 2013
INVENTOR(S) : Shigetoshi Sugawa, Yasushi Kondo and Hideki Tominaga Page 1 of 1

It is certified that error appears in the above-identified patent and that said Letters Patent is hereby corrected as shown below:

On the title page, column 1, item (73), please correct the Assignee section, specifically, the second assignee "Shimadu Corporation" to read --Shimadzu Corporation-- as follows:

--(73)  Assignees:  Tohoku University, Miyagi (JP)

Shimadzu Corporation, Kyoto (JP)--

Signed and Sealed this
Second Day of September, 2014

Michelle K. Lee
*Deputy Director of the United States Patent and Trademark Office*